United States Patent
Wang et al.

(10) Patent No.: US 7,919,372 B2
(45) Date of Patent: *Apr. 5, 2011

(54) METHOD FOR FORMING OXIDE ON ONO STRUCTURE

(75) Inventors: Chih-Hao Wang, Taoyuan (TW); Hsin-Huei Chen, Miaoli (TW); Chong-Jen Huang, Taipei County (TW); Kuang-Wen Liu, Nantou (TW); Jia-Rong Chiou, Keelung (TW); Chong-Mu Chen, Taichung (TW)

(73) Assignee: Macronix International, Co. Ltd., Hsinchu (TW)

( * ) Notice: Subject to any disclaimer, the term of this patent is extended or adjusted under 35 U.S.C. 154(b) by 413 days.

This patent is subject to a terminal disclaimer.

(21) Appl. No.: 11/625,177

(22) Filed: Jan. 19, 2007

(65) Prior Publication Data

US 2007/0117353 A1 May 24, 2007

Related U.S. Application Data (63) Continuation of application No. 10/721,605, filed on Nov. 25, 2003, now Pat. No. 7,183,166.

(51) Int. Cl.
*H01L 21/336* (2006.01)
(52) U.S. Cl. ........ 438/261; 438/287; 438/288; 438/591; 438/773; 438/954; 257/E21.679
(58) Field of Classification Search ............... 438/216, 438/261, 287–288, 771–772, 954, 981, 591, 438/773; 257/E21.679
See application file for complete search history.

(56) References Cited

U.S. PATENT DOCUMENTS

| | | | |
|---|---|---|---|
| 4,949,154 A | 8/1990 | Haken | |
| 5,768,192 A | 6/1998 | Eitan | |
| 5,861,347 A * | 1/1999 | Maiti et al. ............ | 438/787 |
| 5,966,603 A | 10/1999 | Eitan | |
| 6,037,273 A | 3/2000 | Gronet et al. | |
| 6,074,917 A | 6/2000 | Chang et al. | |

(Continued)

*Primary Examiner* — Mary Wilczewski
*Assistant Examiner* — Toniae M Thomas
(74) *Attorney, Agent, or Firm* — Haynes Beffel & Wolfeld LLP (57) ABSTRACT

A semiconductor device having a silicon oxide/silicon nitride/silicon oxide ("ONO") structure is formed by providing a first silicon oxide layer and a silicon nitride layer over a substrate having a memory region and a logic device region; patterning the first silicon oxide layer and the silicon nitride layer to define bottom oxide and silicon nitride portions of partially completed ONO stacks and to expose the substrate in the logic device regions; performing a rapid thermal annealing process in the presence of a radical oxidizing agent to form concurrently a second silicon oxide layer on the exposed surface of the silicon nitride layer and a gate oxide layer over the substrate; and depositing a conductive layer over the completed ONO stacks and the gate oxide. The invention is employed in manufacture of, for example, memory devices having and peripheral logic devices and memory cells including ONO structures. Exposing the patterned silicon nitride to the oxygen radical during the RTO according to the invention significantly reduces the processing time, and reduces the thermal budget. Moreover, because according to the invention the upper surface and the sidewalls of the silicon nitride layer are covered by the top oxide layer, the silicon nitride is not exposed during a subsequent cleaning process. As a result of increased contact area between the polysilicon gate and the top oxide layer, the coupling ratio of the gate is increased.

48 Claims, 7 Drawing Sheets

U.S. PATENT DOCUMENTS

| | | | |
|---|---|---|---|
| 6,117,730 A * | 9/2000 | Komori et al. | 438/258 |
| 6,159,866 A | 12/2000 | Gronet et al. | |
| 6,171,911 B1 | 1/2001 | Yu | |
| 6,184,155 B1 | 2/2001 | Yu et al. | |
| 6,255,230 B1 * | 7/2001 | Ikakura et al. | 438/765 |
| 6,383,861 B1 * | 5/2002 | Gonzalez et al. | 438/241 |
| 6,613,632 B2 * | 9/2003 | Liu et al. | 438/261 |
| 6,670,246 B1 * | 12/2003 | Hsiao et al. | 438/276 |
| 6,677,200 B2 * | 1/2004 | Lee et al. | 438/257 |
| 6,803,279 B2 * | 10/2004 | Eitan | 438/261 |
| 6,946,349 B1 * | 9/2005 | Lee et al. | 438/275 |
| 7,098,147 B2 * | 8/2006 | Nansei et al. | 438/769 |
| 7,232,724 B1 * | 6/2007 | Shiraiwa et al. | 438/262 |
| 7,297,597 B2 * | 11/2007 | Dong et al. | 438/261 |
| 2001/0000247 A1 * | 4/2001 | Shimada et al. | 438/981 |
| 2003/0040189 A1 * | 2/2003 | Chang et al. | 438/700 |
| 2003/0185071 A1 * | 10/2003 | Yoshino | 365/200 |
| 2004/0009642 A1 * | 1/2004 | Yoo et al. | 438/257 |
| 2004/0203253 A1 * | 10/2004 | Yao | 438/765 |
| 2005/0106811 A1 * | 5/2005 | Forbes | 438/257 |

* cited by examiner

METHOD FOR FORMING OXIDE ON ONO STRUCTURE

CROSS-REFERENCE TO RELATED APPLICATIONS

This application is a Continuation of U.S. application Ser. No. 10/721,605 filed on 25 Nov. 2003.

BACKGROUND

This invention relates to semiconductor devices that include a silicon oxide/silicon nitride/silicon oxide (ONO) structure, and to methods for oxide formation in such devices.

In a conventional process for making a device having an ONO structure, a tunnel layer, a silicon nitride layer and a top oxide layer are formed over a substrate, and then an etching process is performed for patterning the ONO structure.

The top oxide layer can be formed by oxidation of the silicon nitride. However, in conventional processes oxidation of silicon nitride is time-consuming and has a very high thermal budget. In some conventional processes, for example, silicon nitride is oxidized by wet oxidation within a furnace at a temperature of 1000° C. over a time period as long as 60 minutes.

Moreover, the oxidation step in such a conventional process is followed by a cleaning process, which may etch the top oxide layer, even to the extent of exposing the corners of the silicon nitride layer so as to cause a leak from the silicon nitride layer to a polysilicon gate formed subsequently. As a result, the charges stored in the silicon nitride layer will be lost, causing an electrical defect in the device.

In one conventional approach to avoiding loss of the top oxide layer during the cleaning process, a tunnel oxide layer and a silicon nitride layer are first deposited and patterned, and then a top oxide layer is grown on the silicon nitride by wet oxidation. However, the oxidation selectivity of wet oxidation for the substrate and the silicon nitride layer is relatively high, that is, the oxidation rate of wet oxidation for the substrate is far greater than that of the silicon nitride layer. Using a wet oxidation in this manner to form a 100 Å thick top oxide layer, for example, will result in a 1000 Å thick oxide layer formed on the substrate. Consequently, where a conventional wet oxidation is used, it is necessary to remove the thicker oxide layer formed on the substrate. This makes for a more complicated process, and can result in an uneven substrate surface.

One approach to growing an oxide on a substrate is referred to as the in situ steam generation ("ISSG") process. In the "ISSG" process, the substrate (typically a semiconductor wafer) is heated to a temperature high enough to catalyze a reaction between an oxygen-containing gas and a hydrogen-containing gas to form oxygen radical. Then the reactive oxygen radical can effectively oxidize the silicon or silicon nitride on the substrate.

U.S. Pat. No. 6,184,155 describes a two step ISSG process for growing an ultra-thin silicon dioxide gate insulator layer for narrow channel length MOSFET devices. A first steam oxidation and in situ anneal in a nitrous oxide ambient is followed by a second steam oxidation and in situ anneal in a nitrous oxide ambient. The two-step procedure is said to result in a silicon dioxide layer having thickness between about 10 Å and 20 Å, providing a gate insulator having reduced leakage current during standby or operating modes, as compared with silicon dioxide gate insulators formed by procedures not employing two-step ISSG.

U.S. Pat. No. 6,171,911 describes a process for selectively and sequentially forming two different thicknesses of thermally grown silicon oxide in a MOSFET device. Regions on the wafer are defined by field isolation. Conventional oxidation methods for making a gate oxide are used to grow a thicker oxide on all the exposed regions; then the wafer is masked and the mask is patterned to expose regions that are to receive a thinner oxide, and the thicker oxide is removed from those regions by wet etching using hydrofluoric acid; then the mask is stripped and the wafer is cleaned with an aqueous solution free of hydrofluoric acid. Then the wafer is subjected to a low pressure rapid thermal anneal (600° C. to 1050° C.) in an ambient containing hydrogen and nitrogen to remove native oxide and to passivate the silicon surface, reducing the residual oxide thickness to about 4 Å. This is said to result in improved thickness uniformity and oxide quality, and the residual oxide film following annealing is said to become a more robust form of silicon oxide.

SUMMARY

According to the invention, a tunnel oxide layer and a silicon nitride layer are formed and patterned, and then an in situ steam generation ("ISSG") is carried out in the presence of an oxygen radical to form simultaneously (concurrently) a top oxide layer, a buried drain oxide layer, and a gate oxide layer in the MOS region. Exposing the exposed patterned silicon nitride to the oxygen radical according to the invention can require as little as about 1 minute's time for oxidation of the silicon nitride. The process time is accordingly much shortened, and the thermal budget is reduced. Moreover, because according to the invention the upper surface and the sidewalls of the silicon nitride layer are covered by the top oxide layer, the silicon nitride is not exposed during a subsequent cleaning process. As a result of increased contact area between the polysilicon gate and the top oxide layer, the coupling ratio of the gate is also increased.

In one general aspect, the invention features a method for forming an oxide in a semiconductor device having an ONO structure, by depositing a tunnel oxide layer and a silicon nitride layer over a substrate, and patterning using a photolithographic process; and performing a rapid thermal oxide process in an oxygen radical-containing ambient to form a top oxide layer concurrently (simultaneously) on the upper surface and sidewalls of the patterned silicon nitride layer, a buried diffusion (source/drain) located in the substrate, and a gate oxide layer on the MOS region of the substrate.

An oxygen radical, as that term is used herein, is an oxygen-containing species capable of independent existence that contains one or more unpaired electrons. An unpaired electron is one that occupies an atomic or molecular orbital by itself. The oxygen radical is a strong oxidizing agent, providing for rapid oxidation of the silicon nitride. Because the difference is small between the oxidation rate for the substrate and the oxidation rate for the silicon nitride layer, oxygen selectivity for the substrate and the silicon nitride layer is low.

According to the invention, the top oxide layer, the buried drain oxide layer and the MOS gate oxide layer can be formed concurrently rather than in separate steps, simplifying the process, and reducing the process time and thermal budget for the process.

In another general aspect the invention features a method for forming a semiconductor device having a silicon oxide/silicon nitride/silicon oxide ("ONO") structure, by forming a first silicon oxide layer and a silicon nitride layer over a substrate, patterning the first silicon oxide layer and the silicon nitride layer, performing a rapid thermal annealing process in the presence of a radical oxidizing agent to form concurrently (simultaneously) a second silicon oxide layer on the exposed surface of the silicon nitride layer and a gate oxide layer over the substrate.

In another general aspect the invention features a method for manufacturing a memory device having a silicon oxide/silicon nitride/silicon oxide ("ONO") structure, by forming a first oxide layer and a silicon nitride layer over a substrate having a memory region and a metal oxide semiconductor region; patterning the first oxide layer and the silicon nitride layer to form patterned first oxide layers and patterned silicon nitride layers on the memory cell region; forming buried source/drains in the regions of the substrate between the patterned first oxide layers; performing a rapid thermal annealing process in the presence of a radical oxidizing agent, concurrently (simultaneously) forming a second silicon oxide layer on the exposed surface of the patterned silicon nitride layer, buried drain oxide layers on the buried source/drains, and a gate oxide layer on the metal oxide semiconductor region.

In some embodiments the radical oxidizing agent includes an oxygen radical, and in particular embodiments the oxygen radical is O'.

In some embodiments the ratio of the thicknesses of the resulting second silicon oxide layer and gate oxide layer is in the range about 0.6:1 to about 0.8:1. In some embodiments, where the device is a memory device having buried source/drains, the thickness of the resulting buried drain oxide layer is greater than the thickness of the resulting gate oxide layer.

In some embodiments the rapid thermal annealing process is an in situ steam generation process, in which the temperature of the substrate (typically a semiconductor wafer) is heated to a temperature within a suitable range, and a hydrogen-containing gas and an oxygen-containing gas are introduced at flow rates within a suitable range, for a period of time suitable to complete the oxidation process. In some embodiments the hydrogen-containing gas and the oxygen-containing gas are introduced together with and in a proportion to a carrier gas within a suitable range.

In some embodiments the hydrogen-containing gas is $H_2$ and the oxygen-containing gas is $O_2$, and the carrier gas (if employed) is $N_2$; the $H_2$ and $O_2$ are introduced at flow rates proportionately in a range ($H_2/H_2+O_2$) about 0.1% to about 40%, more usually in a range about 5% to about 33% ($H_2/H_2+O_2$), and in particular embodiments at flow rates proportionately about 1:19 or 1:3 or 1:2 ($H_2:O_2$); the wafer is held at a temperature in a range about 700° C. to about 1300° C., more usually in a range about 900° C. to about 1150° C. The wafer is exposed to the gas mixture for a time, depending upon the oxide thicknesses desired and depending upon the gas flow rates and the temperature, as few as 1 to 10 seconds and as long as 100 to 1000 seconds or more, more usually for a time as few as 10 seconds, and in particular embodiments for a time as few as 30 seconds, and in some embodiments as long as 120 seconds, and in other embodiments as long as 300 seconds, and in still other embodiments as long as 500 seconds. In particular embodiments of the invention, a temperature of 850° C., or 900° C., or 950° C., or 1000° C. is used; and hydrogen and oxygen are flowed at a ratio ($H_2/H_2+O_2$) about 5%, or 25%, or 33% (e.g., $H_2$ at 6 slm and $O_2$ at 12 slm) for a process time about 30 seconds, or 60 seconds, or 90 seconds, or 120 seconds.

In another general aspect the invention features a semiconductor device having a silicon oxide/silicon nitride/silicon oxide structure, including a first silicon oxide layer over a substrate; a silicon nitride layer over a portion of the first silicon oxide layer; a second silicon oxide layer fully covering the silicon nitride layer and contacting the first silicon oxide layer; and a gate conducting layer over the silicon oxide layer.

In another general aspect the invention features a memory cell having a silicon oxide/silicon nitride/silicon oxide structure, including a buried drain and source located within a substrate; a buried drain/source oxide layer over the buried drain/source; a first silicon oxide layer covering a region of the substrate located between the buried drain/source and covering a portion of the buried drain/source oxide layer; a silicon nitride layer covering a portion of the first silicon oxide layer; a second silicon oxide layer fully covering the silicon nitride layer and contacting the first silicon oxide layer; and a gate conducting layer over the second silicon oxide layer.

In another general aspect the invention features a memory cell having a silicon oxide/silicon nitride/silicon oxide structure in a non-volatile memory, including a buried drain and source located within a substrate; a buried drain/source oxide layer over the buried drain/source; a first silicon oxide layer covering a region of the substrate located between the buried drain and the buried source and covering a portion of the buried drain/source oxide layer; a silicon nitride layer covering a portion of the first silicon oxide layer; a second silicon oxide layer fully covering the silicon nitride layer and contacting the first silicon oxide layer; and a gate conducting layer over the second silicon oxide layer.

In some embodiments the ratio of the thicknesses of the oxide layers on the SiN and on the Si is in a range (SiN/Si) about 0.6:1 to 0.8:1, more usually in a range about 0.68:1 to 0.78:1.

DETAILED DESCRIPTION

The invention will now be described in further detail by reference to the drawings, which illustrate alternative embodiments of the invention. The drawings are diagrammatic, showing features of the invention and their relation to other features and structures, and are not made to scale. For improved clarity of presentation, in the Figs. illustrating embodiments of the invention, elements corresponding to elements shown in other drawings are not all particularly renumbered, although they are all readily identifiable in all the Figs.

According to illustrative embodiments of the invention the oxygen radical is formed in situ, that is, at the heated wafer surface by reactions of $H_2$ and $O_2$ under ISSG conditions. The in situ steam generation process is a low-pressure process wherein $H_2$ and $O_2$ are proportionately mixed and are introduced into the process chamber directly, without pre-combustion. The wafer is heated, and the reaction between $H_2$ and $O_2$ occurs near the wafer surface ("in situ") because the hot wafer acts as the ignition source. Generally, under ISSG conditions the oxygen radical O' is created primarily by way of the following reactions:

$$H_2+O_2 \rightarrow 2OH$$

$$H_2+OH \rightarrow H_2O+H$$

$$O_2+H \rightarrow OH+O'$$

$$H_2+O \rightarrow OH+H$$

The presence of hydrogen during ISSG oxidation accelerates dissociation of molecular oxygen into reactive oxygen atoms. According to the invention, the rate of oxide growth on silicon nitride in the ISSG (that is, thickness of grown oxide versus thickness of silicon nitride consumed) exhibits a strong correlation with atomic oxygen (oxygen radical O') concentration, and not to any other atomic or molecular species. The oxygen radical O' concentration is not dependent upon reactor volume, but depends upon pressure, temperature, and relative amount of hydrogen in the chamber.

The oxygen radical peak concentration results from a balance of radical generation through molecular collisions that are strong functions of temperature and pressure, and recombination processes that are strong functions of pressure or flow rate in the chamber. Accordingly, the ISSG process depends upon using process pressure, flow rate and temperature in the chamber within specified ranges. Accordingly, in some embodiments the following parameters can be effective: temperature in the range about 800° C. to about 1000° C.; pressure in the range about 1 torr to about 20 torr; flow rate of $H_2+O_2$ in the range about 1 slm to about 40 slm. The ratio of $H_2/H_2+O_2$ is in the range about 0.1% to about 40%.

In some embodiments a carrier gas such as nitrogen is flowed through the chamber along with the $H_2$ and $O_2$ mixture, and this may improve process uniformity; but the use of a carrier gas is not essential to in situ generation of the oxygen radical O'. Nitrogen is introduced at a flow rate in the range 0 slm (if not used) to about 50 slm.

In a conventional process, using a high ratio of hydrogen to oxygen (such as 1/67:1) and a high temperature (such as 1000° C.) the ratio of rates of growth of oxide on nitride and on silicon (SiN/Si) as typically about 0.26. According to the invention, a much higher growth rate ratio (SiN/Si) can be achieved, and simultaneous (concurrent) oxide growth on both surfaces can be achieved.

Figure 1:
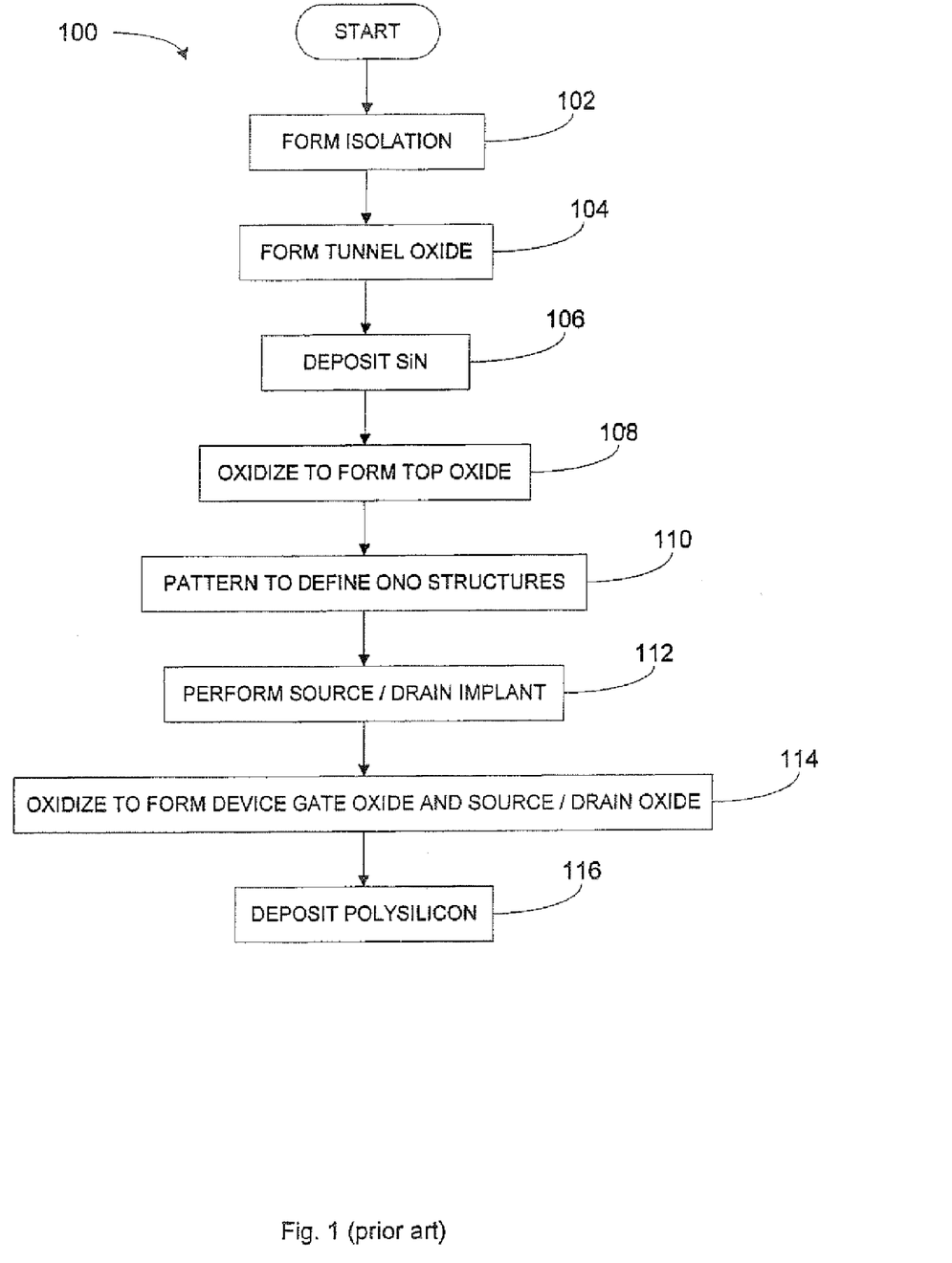
FIG. 1 is a flow diagram showing steps in a conventional oxide forming process.
Figure 2A:
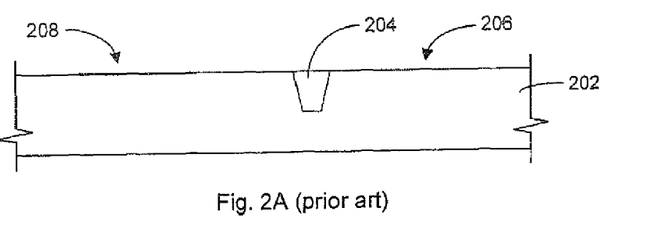
FIGS. 2A-2G are diagrammatic sketches in sectional view showing stages in a conventional oxide forming process as in FIG. 1.
Figure 2B:
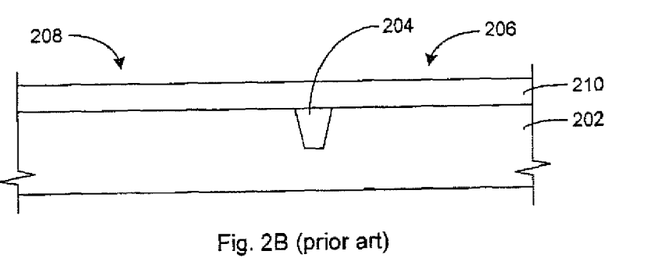
Figure 2C:
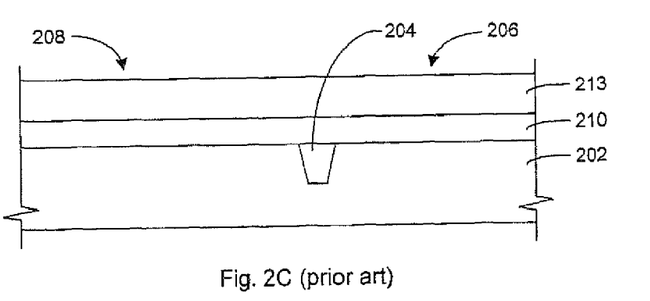
Figure 2D:
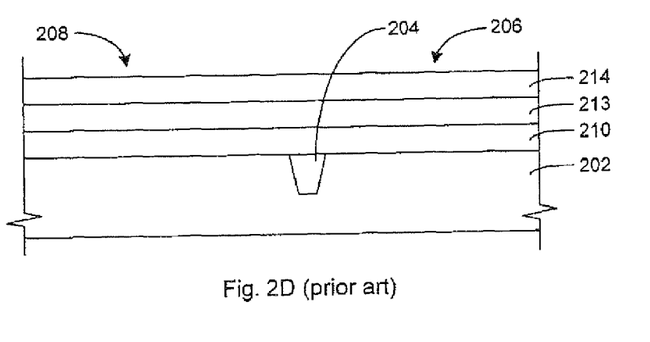
Figure 2E:
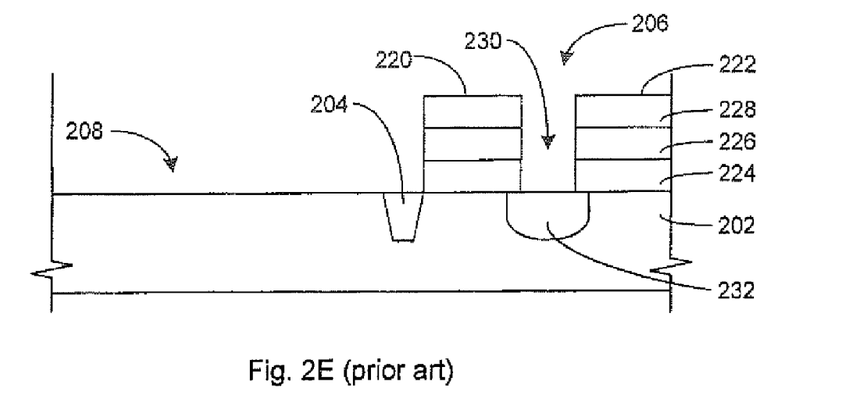
Figure 2F:
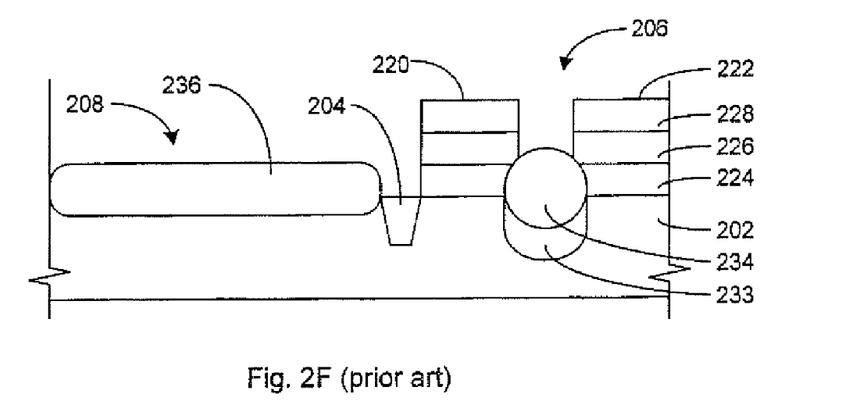
Figure 2G:
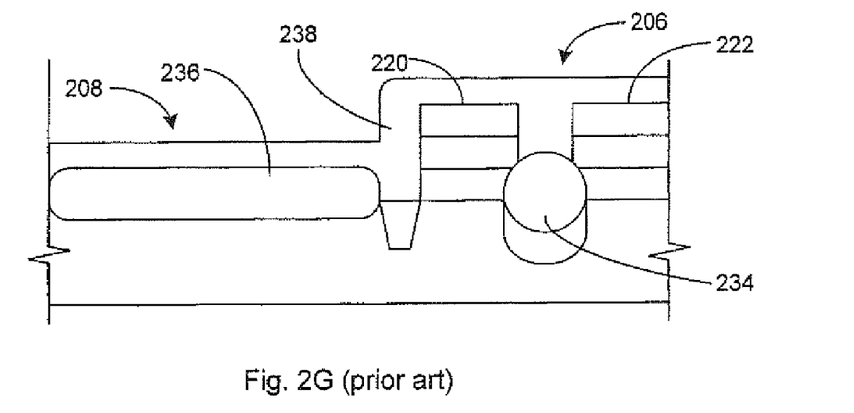

Referring now to FIG. 1, a flow diagram is shown of a conventional process 100 for oxide formation in a device containing an ONO structure. Resulting structures at various stages in the conventional process are shown in diagrammatic sectional views in FIGS. 2A through 2G. In a step 102 of the conventional process 100, a first region 206 and a second region 208 are defined in a substrate 202 such as a silicon wafer by an isolation structure such as a trench isolation structure 204 (FIG. 2A). Memory cells are to be formed in the first region, and logic devices are to be formed in the second region. In a step 104, a tunnel oxide layer 210 is formed over the first and second regions 206, 208 (FIG. 2B). In a step 104, a layer of silicon nitride 212 is deposited over the tunnel oxide layer 210 (FIG. 2C). In a step 108, the layer of silicon nitride is oxidized to form a top oxide layer 214, consuming an upper portion of the silicon nitride layer and resulting in a silicon nitride layer 213 of reduced thickness (FIG. 2D). This completes formation of the ONO film. In a step 110, masking and patterning processes are carried out to define ONO structures 220, 222 over the first region 206 of the substrate 202, exposing the surface of substrate 202 in the region 208. Each resulting ONO structure 220, 222 constitutes an ONO stack including, from the substrate 202 upward, a bottom oxide 224, a silicon nitride 226, and a top oxide 228. The ONO stacks are separated by a source/drain region 230, and in a step 112 an implant is carried out to form a buried diffusion 232, constituting a buried source/drain (FIG. 2E). Then, in a step 112 an oxidation is carried out, resulting in growth of a device gate oxide 236 over the second region 208, and in growth of a source/drain oxide 234, consuming a portion of the buried diffusion and resulting in a buried diffusion 233 of reduced thickness (FIG. 2F). Under the conditions employed here, the thickness of the top oxide of the ONO structures increases only by a very small and relatively insignificant amount, typically a few Å. In a step 116, a polysilicon layer 238 is deposited over the gate oxide 236, the ONO stacks 220, 222, and the buried source/drain oxide 234 (FIG. 2G).

As noted above, removal of the portion of the oxide layer 210 that overlies the second region 208 makes the overall process more complicated, and can result in an uneven substrate surface over the second region.

Figure 3:
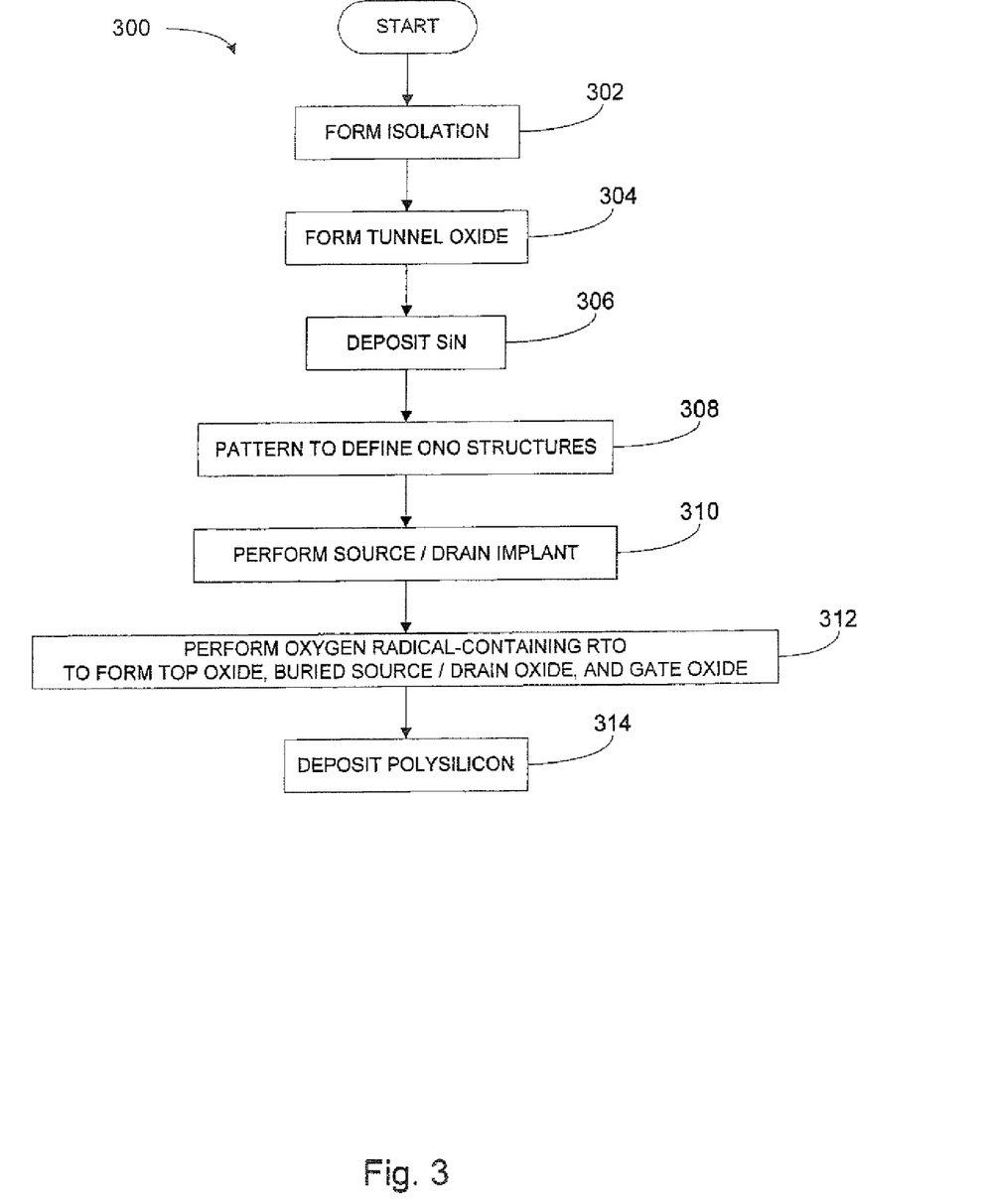
FIG. 3 is a flow diagram showing an oxide forming process according an embodiment of the invention.
Figure 4A:
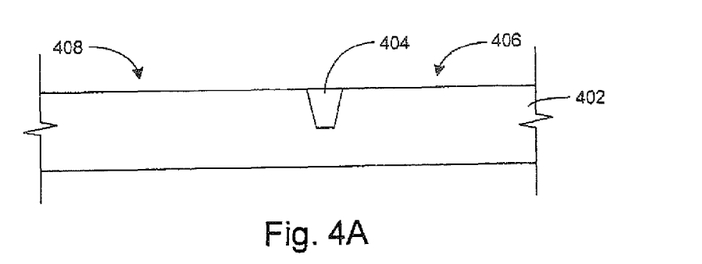
FIGS. 4A-4G are diagrammatic sketches in sectional view showing stages in an oxide forming process according to an embodiment of the invention as in FIG. 3.
Figure 4B:
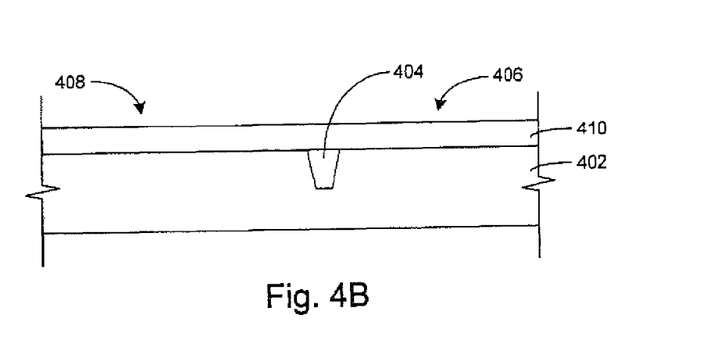
Figure 4C:
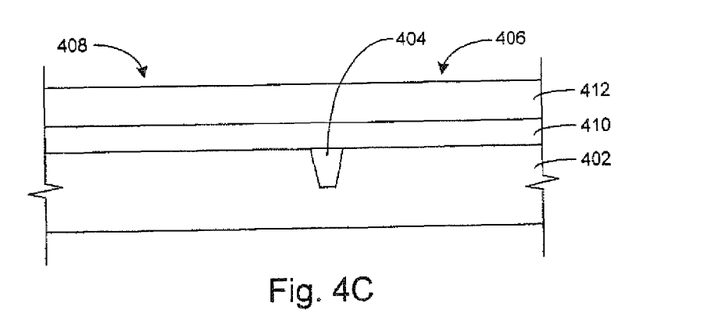
Figure 4D:
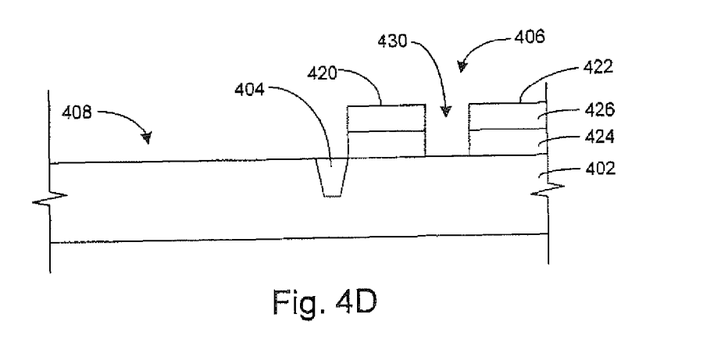
Figure 4E:
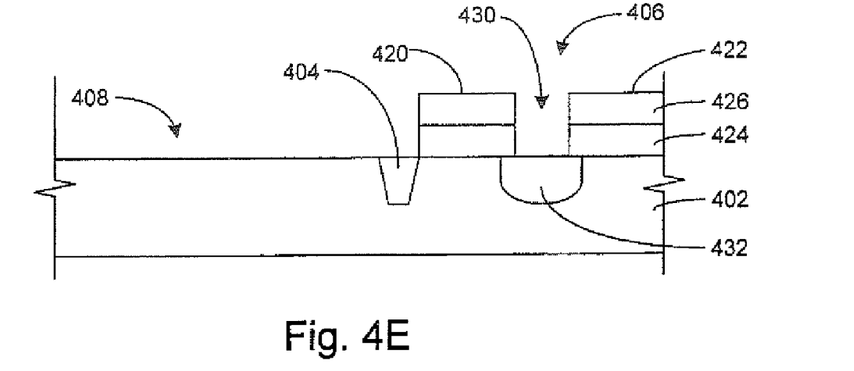

FIG. 3 is a flow diagram of a process for oxide formation according to the invention. Resulting structures at various stages in the process 300 according to the invention are shown in diagrammatic sectional views in FIGS. 4A through 4G. In a step 302 of a process 300 according to the invention, a first region 406, in which memory cells are to be formed, and a second region 408, in which logic devices are to be formed, are defined in a substrate 402 such as a silicon wafer by an isolation structure such as a trench isolation structure 404 (FIG. 4A). In a step 304, a tunnel oxide layer 410 is formed over the first and second regions 406, 408 (FIG. 4B), and in a step 304, a layer of silicon nitride 412 is deposited over the tunnel oxide layer 410 (FIG. 4C). These steps can be carried out using conventional techniques and, as reference to FIG. 4C shows, these steps result in providing a substrate having regions defined by an isolation structure, and covered with a tunnel oxide layer which is overlain by a silicon nitride layer having an exposed surface. According to the invention, in a step 308 masking and patterning processes are carried out to define as shown at 420, 422 the bottom oxide portion 424 and the silicon nitride portion 426 of the ONO structures to be completed over the first region 406 of the substrate 402, exposing the surface of substrate 402 in the region 408 (FIG. 4D). At this point neither the gate oxide for the logic devices in the region 408, nor the top oxide for the ONO structures, has yet been formed. The defined oxide and nitride portions of the respective partially completed ONO stacks are separated by a source/drain region 430, and in a step 310 an implant is carried out to form a buried diffusion, constituting a buried source/drain 432 (FIG. 4E).

Figure 4F:
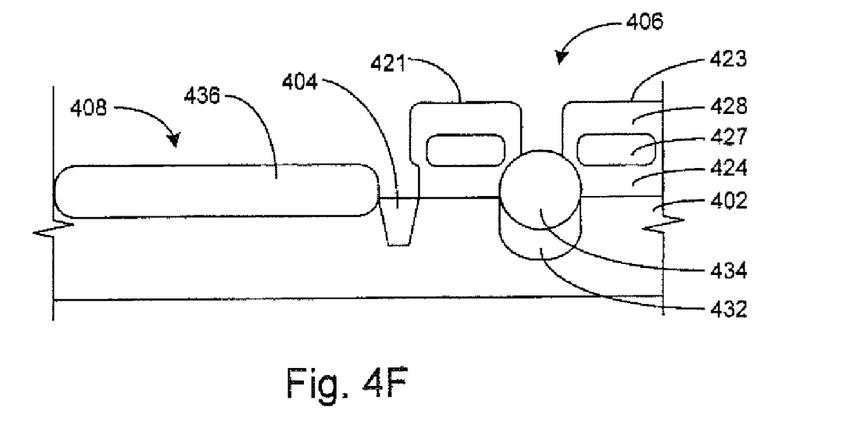

Then, according to the invention, in a step 312 a rapid thermal oxidation ("RTO") is carried out in the presence of an oxygen radical to form simultaneously a top oxide layer 428, a buried drain/source oxide layer 434, and a gate oxide layer 436 (FIG. 4F). As the top oxide layer 428 is grown, a portion of the silicon nitride layer 426 is consumed, leaving a thinner silicon nitride layer 427. Each resulting ONO structure 421, 423 constitutes an ONO stack including, from the substrate 402 upward, a bottom oxide 424, a silicon nitride 427, and a top oxide 428.

Figure 4G:
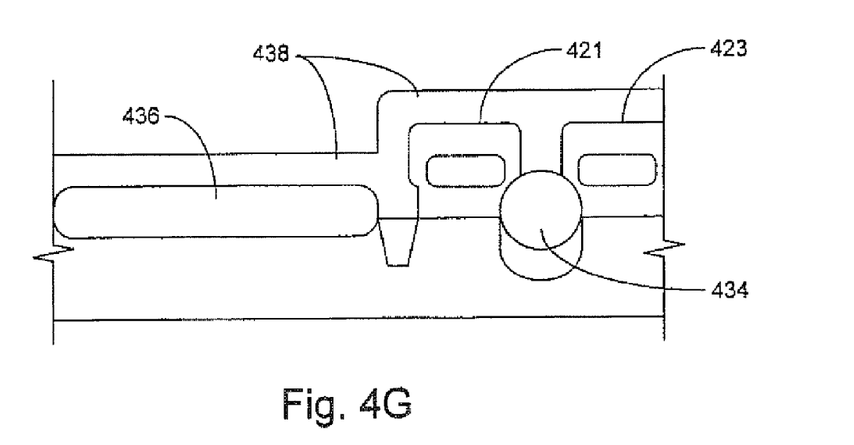

Then, in a step 314 a polysilicon layer 438 is deposited over the gate oxide 436, the ONO stacks 421, 423, and the buried source/drain oxide 434 (FIG. 4G).

Figure 5:
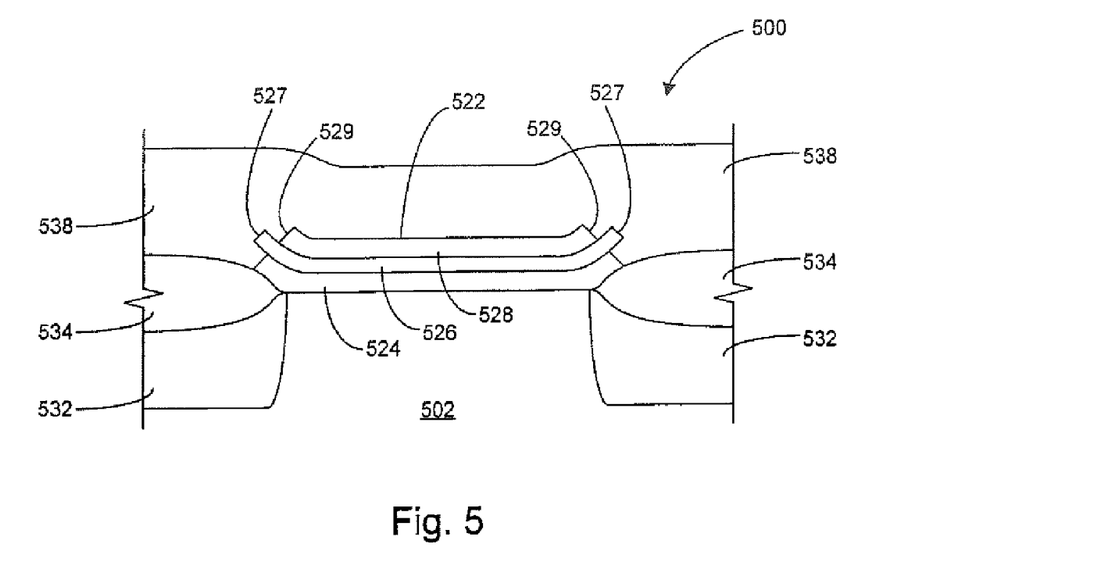
FIG. 5 is a diagrammatic sketch in a sectional view of an ONO structure formed according to a conventional process.

Referring now to FIG. 5, there is shown in a diagrammatic sectional view an ONO structure 500 formed in a memory cell region according to a conventional process. The ONO structure 500 is formed on a substrate 502, and includes an ONO stack 522, made up of, from the substrate upward, a bottom oxide 524, a silicon nitride 526 and a top oxide 528. Buried diffusions (source/drain regions) 532 have been formed by implant into the substrate adjacent the ONO stack, and source/drain oxides 534 have been grown from the buried diffusions 532. The top oxide of the ONO structure and the adjacent source/drain oxides are covered by a polysilicon layer 538. As noted above, the formation of a top oxide in the ONO structure using a conventional wet oxidation is followed by a cleaning process, which can etch the top oxide layer and expose the corners or edges of the silicon nitride layer. Referring again to FIG. 5, in an ONO stack formed in the conventional way the edges 527 of the silicon nitride layer, which were exposed as a result of etching the edges 529 of the top oxide layer 528. When the polysilicon 538 is deposited over the stack, the exposed edges 527 of the nitride contact the overlying polysilicon 538, providing a route for charge leakage from the nitride into the polysilicon, and degrading the performance of the ONO structure.

Figure 6:
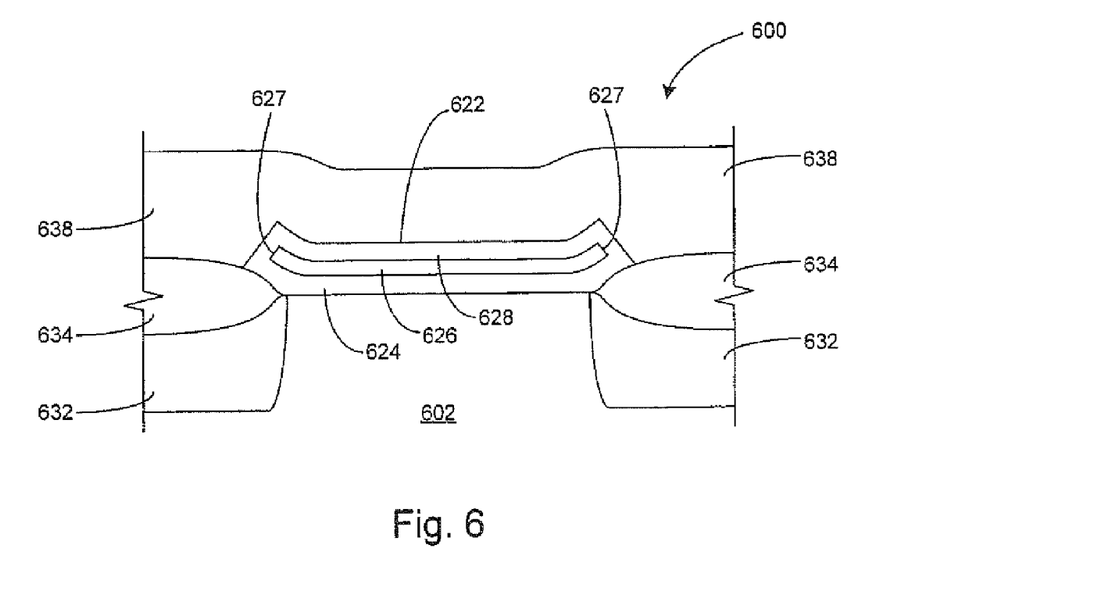
FIG. 6 is a diagrammatic sketch in a sectional view showing an ONO structure formed according to the invention.

This problem is avoided according to the invention, as FIG. 6 shows in a diagrammatic sectional view of an ONO structure 600 formed according to the invention. The ONO structure 600 according to the invention is formed on a substrate 602, and includes an ONO stack 622, made up of, from the substrate upward, a bottom oxide 624, a silicon nitride 626 and a top oxide 628. Buried diffusions (source/drain regions) 632 have been formed by implant into the substrate adjacent the ONO stack, and source/drain oxides 634 have been grown from the buried diffusions 632 during the oxide radical-containing RTO at the same time as the top oxide 628 was formed, as described above with reference to FIG. 3 and FIG. 4D-4F. The top oxide of the ONO structure and the adjacent source/drain oxides are covered by a polysilicon layer 638. According to the invention, the top oxide is grown from exposed surfaces of the silicon nitride layer following patterning of the nitride and bottom oxide portions, and as a result the corners, or edges, of the silicon nitride layer as formed in this way are entirely covered by oxide, which wraps around the edges of the silicon nitride layer to contact the adjacent portions of the drain/source oxide. As a result the nitride is entirely isolated from the subsequently-formed overlying polysilicon layer, providing an ONO structure having improved performance and reliability.

EXAMPLES

Example 1

In this example, patterned Si and SiN surfaces were formed on a wafer substrate, and the wafer was placed in an in situ steam generation furnace. The wafer was heated to about 950° C. in the ISSG chamber, and was exposed to $H_2$ at 2 slm and $O_2$ at 8 slm in $N_2$ as a carrier gas for about 300 seconds, to form oxides on Si to a thickness about 158 Å and SiN to a thickness about 128 Å.

Example 2

In this example, a practical rate of oxide growth on silicon nitride using an ISSG process is compared with a theoretical rate derived from reaction equations.

The theoretical rate can be derived as follows:

$$Si_3N_4 + 6H_2O \rightarrow 3SiO_2 + 4NH_3$$

$Si_3N_4$: (28.086·3+14·4 g/mole)/(3.1 g/cm$^2$)= 45.25 cm$^3$/mole $SiO_2$: (28+16·2 g/mole)/(2.21 g/cm$^2$)=27.18 cm$^3$/mole (27.18·3)/45.25=1.8

A plot of experimental data for oxide growth thickness on (SiNGen) silicon nitride versus silicon nitride consumed thickness using an ISSG process yielded a slope of 1.6301. The difference between the theoretical rate and the measured experimental rate may be accounted for by formation of nitrogen-incorporated oxide (oxynitride) in a thin layer at the interface between the top oxide and the nitride, making a precise location of the oxide-nitride interface difficult to determine, particularly in the thin top oxide film of the ONO stack.

Example 3

In this example the oxide growth rate on (DCS) silicon nitride was compared with that on a silicon substrate using an ISSG process at three temperatures: 850° C., 900° C., and 950° C. Wafers at each temperature were exposed to hydrogen and oxygen flowed at a ratio ($H_2/H_2+O_2$) about 33% ($H_2$ at 6 slm and $O_2$ at 12 slm), and oxide thicknesses were measured at time intervals of about 30 seconds, 60 seconds, 90 seconds, and 120 seconds.

In the 850° C. process, the ratio of growth rates on silicon nitride and on silicon (SiN/Si) ranged about 0.68:1 to 0.75:1; in the 900° C. process, the ratio of growth rates on silicon nitride and on silicon (SiN/Si) ranged about 0.69:1 to 0.75:1; and in the 950° C. process, the ratio of growth rates on silicon nitride and on silicon (SiN/Si) ranged about 0.72:1 to 0.78:1.

Formation of thin oxide films on nitride using conventional methods follows a linear growth law. In contrast, formation of oxide by ISSG is apparently diffusion controlled, as the square of oxide thickness values is linearly proportional to oxidation time, and it conforms to the parabolic growth law.

Example 4

In this example the oxide growth rate using an ISSG process on (DCS) silicon nitride was compared at two different hydrogen and oxygen ratios ($H_2/H_2+O_2$): about 25% and about 33%, at three temperatures: 850° C., 900° C., and 950° C.; and oxide thicknesses were measured at time intervals of about 30 seconds, 60 seconds, 90 seconds, and 120 seconds. The silicon nitride films were prepared using a XT (lamp type) single wafer chamber. Generally, resulting oxides grown at the higher process temperatures were thicker at each time interval, that is, the oxide formation rate was higher at the higher temperatures. Apparently increased kinetic energy of the oxygen radicals enables them to overcome the activation barrier more readily. Also, at each process temperature the oxide formation rate was higher for the higher $H_2/H_2+O_2$ ratio. That is, for a given process temperature the process time to reach a specified oxide thickness is less at the higher hydrogen concentration. Apparently the higher concentration of hydrogen accelerates the dissociation of molecular oxygen to the reactive oxygen radicals and thereby makes more oxygen radicals available for reaction.

Example 5

In this example oxide was grown by ISSG at 850° C. and 950° C. on nitrides formed by a variety of methods, including DCS-based nitrides (XT lamp type chamber), silane-based nitrides grown by (XT lamp type) single wafer chambers, and silane-based nitrides grown using SiNGen single wafer chamber systems. As expected, top oxide growth rates were higher at the higher temperature. At each of the two temperatures growth rates were substantially similar on all three film types.

As will be appreciated from the foregoing, suitable values for one or more of the parameters will differ according to the values of one or more other parameters. Generally, for instance, the processing time can be reduced at higher processing temperatures. And, for instance, for any given processing temperature the processing time can be less at higher proportions of $H_2$ to $O_2$ in the gas mixture. The illustrative examples provided here suggest guidelines for determining, without undue experimentation, preferred combinations of parameters according to the invention other than the specific ones shown.

Other embodiments are within the following claims.

What is claimed is:

1. A method for manufacturing a semiconductor device having an ONO structure, comprising:
    providing an oxide-nitride film on a surface of a substrate, the substrate having first and second regions defined by an isolation structure, the oxide-nitride film including a first silicon oxide layer over the substrate and a silicon nitride layer over the first silicon oxide layer;
    patterning the oxide-nitride film to expose a surface of the substrate in the second region and to define bottom oxide and silicon nitride portions of an ONO stack in the first region of the substrate, the bottom oxide portion and silicon nitride portions having exposed sidewalls and the silicon nitride portion having an exposed surface; and
    exposing the exposed sidewalls and the exposed surface to a radical oxidizing agent while the substrate is at a temperature in a range about 700° C. to about 1200° C., to form concurrently a second oxide layer on the exposed surface and sidewalls of the patterned silicon nitride portion and a gate oxide layer on the substrate surface in the second region; and
    forming a conductive layer over the second oxide layer and over the gate oxide layer.

2. The method of claim 1 wherein the radical oxidizing agent comprises an oxygen radical.

3. The method of claim 1 wherein the radical oxidizing agent comprises O'.

4. The method of claim 1 wherein the exposing comprises heating the substrate to the temperature in the temperature range and exposing the exposed sidewalls and the exposed surface to a mixture of an oxygen-containing gas and a hydrogen-containing gas in a selected proportion at a selected pressure and for a selected time, whereby components of the oxygen-containing gas and the hydrogen-containing gas react to produce the radical oxidizing agent near the heated substrate.

5. The method of claim 4 wherein heating the substrate comprises heating the substrate to a temperature in a range about 900° C. to about 1150° C.

6. The method of claim 4 wherein heating the substrate comprises heating the substrate to a temperature in a range about 850° C. to about 1000° C.

7. The method of claim 1 wherein the exposing comprises heating the substrate to the temperature in the temperature range and exposing the exposed sidewalls and the exposed surface to a mixture of $O_2$ and $H_2$ in a selected proportion at a selected pressure and for a selected time, whereby components of the $O_2$ and $H_2$ react to produce O' near the heated substrate.

8. The method of claim 7 wherein the exposing comprises heating the substrate to a temperature in temperature range, exposing the exposed sidewalls and the exposed surface to a mixture of $O_2$ and $H_2$ in a proportion in a range about 0.1% to about 40% ($H_2/H_2+O_2$) at a pressure in a range about 1 ton to about 20 ton for a time in a range about 1 to 1000 seconds.

9. The method of claim 8 wherein the heating comprises heating the substrate to a temperature in a range about 900° C. to about 1150° C.

10. The method of claim 8 wherein heating the substrate comprises heating the substrate to a temperature in a range about 850° C. to about 1000° C.

11. The method of claim 8 wherein the exposing comprises flowing over the heated substrate a mixture of $O_2$ and $H_2$ in a proportion in a range about 5% to about 33% ($H_2/H_2+O_2$).

12. The method of claim 8 wherein the exposing comprises flowing over the heated substrate a mixture of $O_2$ and $H_2$ in a proportion in a range about 1:19 to about 1:2 ($H_2:O_2$).

13. The method of claim 8 wherein the exposing comprises flowing the mixture of $O_2$ and $H_2$ over the heated substrate for a time in a range about 10 seconds to about 500 seconds.

14. The method of claim 8 wherein the exposing comprises flowing the mixture of $O_2$ and $H_2$ over the heated substrate for a time in a range about 30 seconds to about 300 seconds.

15. The method of claim 1 wherein the exposing comprises heating the substrate in a furnace and flowing into the furnace a mixture of $O_2$ and $H_2$ in a selected proportion at a selected pressure and for a selected time, whereby components of the $O_2$ and $H_2$ react to produce O' near the heated substrate.

16. The method of claim 15 wherein flowing the mixture of $O_2$ and $H_2$ further comprises flowing a carrier gas.

17. The method of claim 16 wherein flowing the mixture of $O_2$ and $H_2$ further comprises flowing $N_2$ as a carrier gas.

18. The method of claim 15 wherein flowing the mixture of $O_2$ and $H_2$ in a selected proportion comprises flowing the $O_2$ and $H_2$ at selected proportional flow rates.

19. The method of claim 18 wherein flowing the mixture of $O_2$ and $H_2$ further comprises flowing $N_2$ as a carrier gas at a selected flow rate.

20. The method of claim 18 wherein flowing the $O_2$ and $H_2$ comprises flowing $O_2$ and $H_2$ at a combined flow rate in a range about 1 to about 40 slm.

21. The method of claim 19 wherein flowing the $O_2$ and $H_2$ comprises flowing $O_2$ and $H_2$ at a combined flow rate in a range about 1 to about 40 slm, and flowing $N_2$ comprises flowing $N_2$ at a flow rate up to about 50 slm.

22. The method of claim 1 wherein a ratio of thicknesses of the formed second oxide layer and the formed gate oxide layer is in a range about 0.6:1 to about 0.8:1.

23. The method of claim 1 wherein the exposing comprises heating the substrate in a furnace and generating the radical oxidizing agent within the furnace while holding the substrate at a temperature in the temperature range for a time in a range about 10 seconds to about 500 seconds.

24. The method of claim 1 wherein the exposing comprises heating the substrate in a furnace and generating the radical oxidizing agent within the furnace while holding the substrate at a temperature in the temperature range for a time in a range about 30 seconds to about 300 seconds.

25. A method for manufacturing a memory device having an ONO structure, comprising:
    providing an oxide-nitride film on a surface of a substrate, the substrate having first and second regions defined by an isolation structure, the oxide-nitride film including a first silicon oxide layer over the substrate and a silicon nitride layer over the first silicon oxide layer;
    patterning the oxide-nitride film to expose a surface of the substrate in the second region and to define bottom oxide and silicon nitride portions of an ONO stack in the first region of the substrate, the bottom oxide portion and silicon nitride portions having exposed sidewalls and the silicon nitride portion having an exposed surface; and exposing the exposed sidewalls and the exposed surface to a radical oxidizing agent while the substrate is at a temperature in a range about 700° C. to about 1200° C., to form concurrently a second oxide layer on the exposed surface and sidewalls of the patterned silicon nitride portion and a gate oxide layer on the substrate surface in the second region; and forming a conductive layer over the second oxide layer and over the gate oxide layer.

26. The method of claim 25 wherein the radical oxidizing agent comprises an oxygen radical.

27. The method of claim 25 wherein the radical oxidizing agent comprises O'.

28. The method of claim 25 wherein the exposing comprises heating the substrate to the temperature in the temperature range and exposing the exposed sidewalls and the exposed surface to a mixture of an oxygen-containing gas and a hydrogen-containing gas in a selected proportion at a selected pressure and for a selected time, whereby components of the oxygen-containing gas and the hydrogen-containing gas react to produce the radical oxidizing agent near the heated substrate.

29. The method of claim 28 wherein heating the substrate comprises heating the substrate to a temperature in a range about 900° C. to about 1150° C.

30. The method of claim 28 wherein heating the substrate comprises heating the substrate to a temperature in a range about 850° C. to about 1000° C.

31. The method of claim 25 wherein the exposing comprises heating the substrate to the temperature in the temperature range and exposing the exposed sidewalls and the exposed surface to a mixture of $O_2$ and $H_2$ in a selected proportion at a selected pressure and for a selected time, whereby components of the $O_2$ and $H_2$ react to produce O' near the heated substrate.

32. The method of claim 31 wherein the exposing comprises heating the substrate to a temperature in temperature range, exposing the exposed sidewalls and the exposed surface to a mixture of $O_2$ and $H_2$ in a proportion in a range about 0.1% to about 40% ($H_2/H_2+O_2$) at a pressure in a range about 1 torr to about 20 torr for a time in a range about 1 to 1000 seconds.

33. The method of claim 32 wherein the heating comprises heating the substrate to a temperature in a range about 900° C. to about 1150° C.

34. The method of claim 32 wherein heating substrate comprises heating the substrate to a temperature in a range about 850° C. to about 1000° C.

35. The method of claim 32 wherein the exposing comprises flowing over the heated substrate a mixture of $O_2$ and $H_2$ in a proportion in a range about 5% to about 33% ($H_2/H_2+O_2$).

36. The method of claim 32 wherein the exposing comprises flowing over the heated substrate a mixture of $O_2$ and $H_2$ in a proportion in a range about 1:19 to about 1:2 ($H_2:O_2$).

37. The method of claim 32 wherein the exposing comprises flowing the mixture of $O_2$ and $H_2$ over the heated substrate for a time in a range about 10 seconds to about 500 seconds.

38. The method of claim 32 wherein the exposing comprises flowing the mixture of $O_2$ and $H_2$ over the heated substrate for a time in a range about 30 seconds to about 300 seconds.

39. The method of claim 25 wherein the exposing comprises heating the substrate in a furnace and flowing into the furnace a mixture of $O_2$ and $H_2$ in a selected proportion at a selected pressure and for a selected time, whereby components of the $O_2$ and $H_2$ react to produce O' near the heated substrate.

40. The method of claim 39 wherein flowing the mixture of $O_2$ and $H_2$ further comprises flowing a carrier gas.

41. The method of claim 40 wherein flowing the mixture of $O_2$ and $H_2$ further comprises flowing $N_2$ as a carrier gas.

42. The method of claim 39 wherein flowing the mixture of $O_2$ and $H_2$ in a selected proportion comprises flowing the $O_2$ and $H_2$ at selected proportional flow rates.

43. The method of claim 42 wherein flowing the mixture of $O_2$ and $H_2$ further comprises flowing $N_2$ as a carrier gas at a selected flow rate.

44. The method of claim 42 wherein flowing the $O_2$ and $H_2$ comprises flowing $O_2$ and $H_2$ at a combined flow rate in a range about 1 to about 40 slm.

45. The method of claim 43 wherein flowing the $O_2$ and $H_2$ comprises flowing $O_2$ and $H_2$ at a combined flow rate in a range about 1 to about 40 slm, and flowing $N_2$ comprises flowing $N_2$ at a flow rate up to about 50 slm.

46. The method of claim 25 wherein a ratio of thicknesses of the formed second oxide layer and the formed gate oxide layer is in a range about 0.6:1 to about 0.8:1.

47. The method of claim 25 wherein the exposing comprises heating the substrate in a furnace and generating the radical oxidizing agent within the furnace while holding the substrate at a temperature in the temperature range for a time in a range about 10 seconds to about 500 seconds.

48. The method of claim 25 wherein the exposing comprises heating the substrate in a furnace and generating the radical oxidizing agent within the furnace while holding the substrate at a temperature in the temperature range for a time in a range about 30 seconds to about 300 seconds.

* * * * *

UNITED STATES PATENT AND TRADEMARK OFFICE
CERTIFICATE OF CORRECTION

PATENT NO. : 7,919,372 B2
APPLICATION NO. : 11/625177
DATED : April 5, 2011
INVENTOR(S) : Chih-Hao Wang et al.

It is certified that error appears in the above-identified patent and that said Letters Patent is hereby corrected as shown below:

** In the Specification:

At column 1, line number 64, delete "about 10 Å and 20 Å" and insert -- about 10 Å and 20 Å -- in place thereof.

At column 2, line number 15, delete "Å" and insert -- Å -- in place thereof.

At column 3, line number 23, delete "O'" and insert -- O˙ -- in place thereof.

At column 5, line number 3, delete "O'" and insert -- O˙ -- in place thereof.

At column 5, line number 9, delete "O'" and insert -- O˙ -- in place thereof.

At column 5, line number 18, delete "O'" and insert -- O˙ -- in place thereof.

At column 5, line number 20, delete "O'" and insert -- O˙ -- in place thereof.

At column 5, line number 39, delete "O'" and insert -- O˙ -- in place thereof.

** In the Claims:

At column 9, line number 42, delete "O'" and insert -- O˙ -- in place thereof.

At column 9, line number 63, delete "O'" and insert -- O˙ -- in place thereof.

At column 10, line numbers 2-3, delete "1 ton to about 20 ton" and insert -- 1 torr to about 20 torr -- in place thereof.

At column 10, line number 26, delete "O'" and insert -- O˙ -- in place thereof.

At column 11, line number 15, delete "O'" and insert -- O˙ -- in place thereof.

Signed and Sealed this
Seventh Day of June, 2011

David J. Kappos
*Director of the United States Patent and Trademark Office*

CERTIFICATE OF CORRECTION (continued)
U.S. Pat. No. 7,919,372 B2

** In the Claims:

At column 11, line number 37, delete "O'" and insert -- O˙ -- in place thereof.

At column 12, line number 19, delete "O'" and insert -- O˙ -- in place thereof.